(12) United States Patent
Han et al.

(10) Patent No.: US 11,018,231 B2
(45) Date of Patent: May 25, 2021

(54) METHOD TO MAKE BURIED, HIGHLY CONDUCTIVE P-TYPE III-NITRIDE LAYERS

(71) Applicant: Yale University, New Haven, CT (US)

(72) Inventors: Jung Han, Woodbridge, CT (US); Yufeng Li, Shaanxi (CN); Cheng Zhang, New Haven, CT (US); Sung Hyun Park, New Haven, CT (US)

(73) Assignee: Yale University, New Haven, CT (US)

( * ) Notice: Subject to any disclaimer, the term of this patent is extended or adjusted under 35 U.S.C. 154(b) by 0 days.

(21) Appl. No.: 14/954,195

(22) Filed: Nov. 30, 2015

(65) Prior Publication Data

US 2016/0197151 A1 Jul. 7, 2016

Related U.S. Application Data

(60) Provisional application No. 62/086,020, filed on Dec. 1, 2014.

(51) Int. Cl.
*H01L 29/20* (2006.01)
*H01L 31/0304* (2006.01)
(Continued)

(52) U.S. Cl.
CPC ........ *H01L 29/2003* (2013.01); *H01L 21/306* (2013.01); *H01L 21/3245* (2013.01);
(Continued)

(58) Field of Classification Search
CPC ............. H01L 29/2003; H01L 29/0692; H01L 29/6631; H01L 33/40; H01L 33/16;
(Continued)

(56) References Cited

U.S. PATENT DOCUMENTS 5,262,021 A 11/1993 Volker et al.
5,307,361 A 4/1994 Kahen et al.
(Continued)

FOREIGN PATENT DOCUMENTS

CN 101443887 A 5/2009
CN 102782818 A 11/2012
(Continued)

OTHER PUBLICATIONS

Amano et al., P-Type Conduction in Mg-Doped GaN Treated with Low-Energy Electron Beam Irradiation (LEEBI). Jpn J Appl Phys. 1989;28:L2112-4.
(Continued)

*Primary Examiner* — Mohammed R Alam
(74) *Attorney, Agent, or Firm* — Wolf, Greenfield & Sacks, P.C.

(57) ABSTRACT

A conductive, porous gallium-nitride layer can be formed as an active layer in a multilayer structure adjacent to one or more p-type III-nitride layers, which may be buried in a multilayer stack of an integrated device. During an annealing process, dopant-bound atomic species in the p-type layers that might otherwise neutralize the dopants may dissociate and out-diffuse from the device through the porous layer. The release and removal of the neutralizing species may reduce layer resistance and improve device performance.

28 Claims, 7 Drawing Sheets

(51) Int. Cl.

| | | |
|---|---|---|
| *H01L 21/324* | (2006.01) | |
| *H01L 33/40* | (2010.01) | |
| *H01L 21/306* | (2006.01) | |
| *H01L 33/16* | (2010.01) | |
| *H01L 31/0352* | (2006.01) | |
| *H01L 31/036* | (2006.01) | |
| *H01L 31/0725* | (2012.01) | |
| *H01L 31/0735* | (2012.01) | |
| H01L 33/32 | (2010.01) | |
| H01L 29/207 | (2006.01) | |
| H01L 29/15 | (2006.01) | |
| H01L 29/88 | (2006.01) | |

(52) U.S. Cl.
CPC ...... *H01L 31/036* (2013.01); *H01L 31/03044* (2013.01); *H01L 31/035236* (2013.01); *H01L 31/0725* (2013.01); *H01L 31/0735* (2013.01); *H01L 33/16* (2013.01); *H01L 33/40* (2013.01); *H01L 29/15* (2013.01); *H01L 29/207* (2013.01); *H01L 29/88* (2013.01); *H01L 33/32* (2013.01); *H01L 2933/0016* (2013.01)

(58) Field of Classification Search
CPC ............. H01L 21/306; H01L 31/03044; H01L 21/3245; H01L 29/15; H01L 29/88; H01L 2933/0016; H01L 33/32; H01L 29/207
See application file for complete search history.

(56) References Cited

U.S. PATENT DOCUMENTS

| | | | |
|---|---|---|---|
| 5,502,787 A | 3/1996 | Capasso et al. | |
| 5,509,026 A | 4/1996 | Sasaki et al. | |
| 5,644,156 A | 7/1997 | Suzuki et al. | |
| 5,818,861 A | 10/1998 | Tan et al. | |
| 5,919,430 A | 7/1999 | Hasenzahl et al. | |
| 6,233,267 B1 | 5/2001 | Nurmikko et al. | |
| 6,306,672 B1 | 10/2001 | Kim | |
| 6,320,206 B1 | 11/2001 | Coman et al. | |
| 6,537,838 B2* | 3/2003 | Stockman | H01L 21/3245 257/96 |
| 6,597,017 B1 | 7/2003 | Seko et al. | |
| 6,597,490 B2 | 7/2003 | Tayebati | |
| 6,759,310 B2 | 7/2004 | Hiroshi | |
| 6,990,132 B2 | 1/2006 | Kneissl et al. | |
| 7,271,417 B2 | 9/2007 | Chen | |
| 7,750,234 B2 | 7/2010 | Deng et al. | |
| 7,751,455 B2 | 7/2010 | Kneissl | |
| 7,923,275 B2 | 4/2011 | Nakagawa | |
| 7,928,448 B2 | 4/2011 | Wierer, Jr. et al. | |
| 7,989,323 B2 | 8/2011 | Shenai-Khatkhate | |
| 8,174,025 B2 | 5/2012 | Epler et al. | |
| 8,343,788 B2 | 1/2013 | Kuo et al. | |
| 8,344,409 B2 | 1/2013 | Peng et al. | |
| 8,497,171 B1 | 7/2013 | Wu et al. | |
| 8,507,925 B2 | 8/2013 | Kuo et al. | |
| 8,519,430 B2 | 8/2013 | Peng et al. | |
| 9,206,524 B2 | 12/2015 | Zhang et al. | |
| 9,356,187 B2 | 5/2016 | Ryu et al. | |
| 9,583,353 B2 | 2/2017 | Han | |
| 2002/0036295 A1 | 3/2002 | Nunoue et al. | |
| 2002/0070125 A1 | 6/2002 | Ng et al. | |
| 2002/0075929 A1 | 6/2002 | Cunningham | |
| 2002/0153595 A1 | 10/2002 | Tayanaka | |
| 2002/0158265 A1 | 10/2002 | Eisenbeiser | |
| 2003/0178633 A1 | 9/2003 | Flynn et al. | |
| 2003/0180980 A1 | 9/2003 | Margalith et al. | |
| 2003/0189963 A1 | 10/2003 | Deppe et al. | |
| 2004/0021147 A1 | 2/2004 | Ishibashi | |
| 2004/0104398 A1 | 6/2004 | Hon et al. | |
| 2005/0029224 A1 | 2/2005 | Bernard et al. | |
| 2005/0184307 A1 | 8/2005 | Li et al. | |
| 2005/0224816 A1 | 10/2005 | Kim et al. | |
| 2005/0242365 A1 | 11/2005 | Yoo | |
| 2006/0046513 A1 | 3/2006 | Shea et al. | |
| 2006/0081832 A1* | 4/2006 | Chen | H01L 33/18 257/13 |
| 2006/0110926 A1 | 5/2006 | Hu et al. | |
| 2006/0199353 A1 | 9/2006 | Kub et al. | |
| 2007/0007241 A1 | 1/2007 | DeLouise | |
| 2007/0040162 A1 | 2/2007 | Song | |
| 2007/0085100 A1 | 4/2007 | Diana et al. | |
| 2007/0111345 A1 | 5/2007 | Wong et al. | |
| 2007/0194330 A1* | 8/2007 | Ibbetson | H01L 33/04 257/81 |
| 2007/0284607 A1 | 12/2007 | Epler et al. | |
| 2008/0029773 A1 | 2/2008 | Jorgenson | |
| 2008/0067532 A1 | 3/2008 | Watson et al. | |
| 2008/0179605 A1 | 7/2008 | Takase et al. | |
| 2008/0280140 A1 | 11/2008 | Ferrari et al. | |
| 2008/0285610 A1 | 11/2008 | Hall et al. | |
| 2008/0296173 A1 | 12/2008 | Mishra | |
| 2008/0298419 A1 | 12/2008 | Hori et al. | |
| 2009/0001416 A1 | 1/2009 | Chua et al. | |
| 2009/0117675 A1 | 5/2009 | Yamanaka et al. | |
| 2009/0140274 A1 | 6/2009 | Wierer, Jr. et al. | |
| 2009/0143227 A1 | 6/2009 | Dubrow et al. | |
| 2009/0168819 A1 | 7/2009 | Otoma | |
| 2009/0173373 A1* | 7/2009 | Walukiewicz | H01L 31/072 136/244 |
| 2010/0142576 A1 | 6/2010 | Cohen et al. | |
| 2010/0195689 A1 | 8/2010 | Ariga et al. | |
| 2010/0246625 A1 | 9/2010 | Kawashima et al. | |
| 2010/0270649 A1 | 10/2010 | Ishibashi et al. | |
| 2010/0317132 A1 | 12/2010 | Rogers et al. | |
| 2011/0076854 A1 | 3/2011 | Takeo et al. | |
| 2011/0101391 A1 | 5/2011 | Miki et al. | |
| 2011/0188528 A1 | 8/2011 | Kisin et al. | |
| 2012/0018753 A1 | 1/2012 | Hao et al. | |
| 2012/0025231 A1 | 2/2012 | Krames et al. | |
| 2012/0068214 A1 | 3/2012 | Kuo et al. | |
| 2012/0189030 A1 | 7/2012 | Miyoshi | |
| 2012/0205665 A1 | 8/2012 | Nam et al. | |
| 2013/0011656 A1 | 1/2013 | Zhang et al. | |
| 2013/0050686 A1 | 2/2013 | Wunderer et al. | |
| 2013/0134457 A1 | 5/2013 | Peng et al. | |
| 2013/0140517 A1 | 6/2013 | Tang et al. | |
| 2013/0207237 A1 | 8/2013 | Weisbuch et al. | |
| 2013/0210180 A1 | 8/2013 | Wang | |
| 2013/0248911 A1 | 9/2013 | Hwang et al. | |
| 2013/0328102 A1* | 12/2013 | Peng | H01L 33/0066 257/103 |
| 2013/0334555 A1* | 12/2013 | Hsieh | H01L 33/16 257/98 |
| 2014/0003458 A1 | 1/2014 | Han | |
| 2014/0048830 A1* | 2/2014 | Kuo | H01L 33/22 257/98 |
| 2014/0064313 A1 | 3/2014 | Sato et al. | |
| 2014/0191369 A1* | 7/2014 | Tsuchiya | H01L 29/6631 257/615 |
| 2014/0203292 A1 | 7/2014 | Hwang et al. | |
| 2014/0339566 A1 | 11/2014 | Seo et al. | |
| 2015/0303655 A1 | 10/2015 | Han et al. | |
| 2016/0153113 A1 | 6/2016 | Zhang et al. | |
| 2017/0133826 A1 | 5/2017 | Han | |
| 2017/0237234 A1 | 8/2017 | Han et al. | |
| 2018/0152003 A1 | 5/2018 | Han et al. | |

FOREIGN PATENT DOCUMENTS

| | | |
|---|---|---|
| CN | 102823089 A | 12/2012 |
| CN | 103762286 A | 4/2014 |
| CN | 104205369 A | 12/2014 |
| JP | H05-315316 A | 11/1993 |
| JP | H10-135500 A | 5/1998 |
| JP | H11-195562 A | 7/1999 |
| JP | 2000-124552 A | 4/2000 |
| JP | 2000-349267 A | 12/2000 |
| JP | 2001-188264 A | 7/2001 |
| JP | 2001-223165 A | 8/2001 |
| JP | 2004-055611 A | 2/2004 |

(56) References Cited

FOREIGN PATENT DOCUMENTS

| | | |
|---|---|---|
| JP | 2005-244089 A | 9/2005 |
| JP | 2006-332595 A | 12/2006 |
| JP | 2007-073945 A | 3/2007 |
| JP | 2007-518075 | 7/2007 |
| JP | 2007-335879 A | 12/2007 |
| JP | 2008-226974 A | 9/2008 |
| JP | 2009-055056 A | 3/2009 |
| JP | 2009-067658 A | 4/2009 |
| JP | 2009-094360 A | 4/2009 |
| JP | 2009-231833 A | 10/2009 |
| JP | 2009-239034 A | 10/2009 |
| JP | 2010-218510 A | 9/2010 |
| JP | 2012-049292 A | 3/2012 |
| JP | 2013-038394 A | 2/2013 |
| JP | 2013-518447 A | 5/2013 |
| JP | 2014-507069 A | 3/2014 |
| KR | 2000-0038997 A | 7/2000 |
| KR | 100480764 B1 | 6/2005 |
| WO | WO 2005/066612 A2 | 7/2005 |
| WO | WO 2009/048265 A1 | 4/2009 |
| WO | WO 2011/013621 A1 | 2/2011 |
| WO | WO 2011/094391 A1 | 8/2011 |
| WO | WO 2013/050686 A1 | 4/2013 |
| WO | WO 2014/061174 A1 | 4/2014 |

OTHER PUBLICATIONS

Chen et al., High reflectance membrane-based distributed Bragg reflectors for GaN photonics. Appl Phys Lett. 2012;101:221104.

Chen et al., Flexible, Compliant GaN Nanomembranes for Photonic Applications. 10th International Conference on Nitride Semiconductors. Abstract. Aug. 25, 2013. 2 pages.

Chen et al., Nanopores in GaN by electrochemical anodization in hydrofluoric acid: Formatio and mechanism. J Appl Physics. 2012;112:064303.

Chung et al., Effect of Oxygen on the Activation of Mg Acceptor in GaN Epilayers Grown by Metalorganic Chemical Vapor Deposition. Jpn J Appl Phys. 2000;39(1,8):4749-50.

Dorsaz et al., Selective oxidation of AllnN layers for current confinement in Ill-nitride devices. Appl Phys Lett. 2005;87:072102.

Higuchi et al., Room-temperature CW lasing of a GaN-based vervical-cavity surface-emitting laser by current injection. Appl Phys Express. 2008;1(12):121102.

Holder et al., Demonstration of nonpolar GaN-based vertical-cavity surface-emitting lasers. Proc SPIE. Mar. 13, 2013;8639:863906.1-10. doi: 10.1117/12.2008277.

Kamiura et al., Photo-Enhanced Activation of Hydrogen-Passivated Magnesium in P-Type GaN Films. Jpn J Appl Phys. 1998;37(2,8B):L970-1.

Kasahara et al., Demonstration of blue and green GaN based vertical cavity surface emitting lasers by current injection at room temperature. Appl Phys Express. 2011;4:072103.

Kiefer et al., Si/Ge junctions formed by nanomembrane bonding. ACS Nano. Feb. 22, 2011;5(2):1179-89. doi: 10.1021/nn103149c. Epub Jan. 19, 2011. 11 pages.

Kim et al., Reactivation of Mg acceptor in Mg-doped GaN by nitrogen plasma treatment. Appl Phys Lett. May 22, 2000;76(21):3079-81.

Krishnamoorthy et al., InGaN/GaN tunnel junctions for hole injection in GaN light emitting diodes. Appl Phys Lett. Jun. 10, 2014;105(14):141104. doi: 10.1063/1.4897342. 16 pages.

Kurokawa et al., Multijunction GaInN-based solar cells using a tunnel junction. Appl Phys Express. Mar. 3, 2014;7(3):034104.1-4.

Kuwano et al., Lateral Hydrogen Diffusion at p-GaN Layers in Nitride-Based Light Emitting Diodes with Tunnel Junctions. Jpn J Appl Phys. Aug. 20, 2013;52(8S):08JK12.1-3.

Lu et al., CW lasing of current injection blue GaN-based vertical cavity surface emitting laser. Appl Phys Lett. 2008;92:141102.

Myers et al., Diffusion, release, and uptake of hydrogen in magnesium-doped gallium nitride: Theory and experiment. J Appl Phys. Mar. 15, 2001;89(6):3195-202.

Nakamura et al., Hole Compensation Mechanism of P-Type GaN Films. Jpn J Appl Phys. May 1992;31(1,5A):1258-66.

Paskiewicz et al., Defect-free single-crystal SiGe: a new material from nanomembrane strain engineering. ACS Nano. Jul. 26, 2011;5(7):5814-22. doi: 10.1021/nn201547k. Epub Jun. 16, 2011.

Piprek, Blue light emitting diode exceeding 100% quantum efficiency. Phys Status Solidi RRL. Feb. 4, 2014;8(5):424-6. doi: 10.1002/pssr.201409027.

Rogers et al., Synthesis, assembly and applications of semiconductor nanomembranes. Nature. Aug. 31, 2011;477(7362):45-53. doi: 10.1038/nature10381.

Someya et al., Room temperature lasing at blue wavelengths in gallium nitride microcavities. Science. Sep. 7, 1999;285(5435):1905-6.

Yerino et al., Shape transformation of nanoporous GaN by annealing: From buried cavities to nanomembranes. Appl Phys Lett. Jun. 2011;98(25):251910.1-3. doi: 10.1063/1.3601861.

Zhang et al., A conductivity-based selective etching for next generation GaN devices. Physica Status Solidi B. Jul. 2010;247(7):1713-6. doi: 10.1002/pssb.200983650.

Zhou et al., Near ultraviolet optically pumped vertical cavity laser. Electron Lett. Oct. 12, 2000;36(21):1777-9.

Sundararajan et al., Gallium nitride: Method of defect characterization by wet oxidation in an oxalic acid electrolytic cell. J Vac Sci Tech B. Sep. 27, 2002;20(4):1339-41.

Yam et al., Structural and optical characteristics of porous GaN generated by electroless chemical etching. Mater Lett. 2008;63:724-7.

U.S. Appl. No. 15/423,101, filed Feb. 2, 2017, Han.

U.S. Appl. No. 15/416,131, filed Jan. 26, 2017, Han.

International Search Report and Written Opinion for International Application No. PCT/US2013/046852, dated Oct. 29, 2013.

International Preliminary Report on Patentability for International Application No. PCT/US2013/046852, dated Jan. 8, 2015.

Extended European Search Report for European Application No. 11737629.3, dated Oct. 12, 2017.

International Search Report and Written Opinion for International Application No. PCT/US2011/022701, dated Apr. 8, 2011.

International Preliminary Report on Patentability, dated Aug. 9, 2012 for Application No. PCT/US2011/022701.

Extended European Search Report for European Application No. 15846362.0, dated Apr. 24, 2018.

International Search Report and Written Opinion for International Application No. PCT/US2015/053254, dated Dec. 29, 2015.

International Preliminary Report on Patentability for International Application No. PCT/US2015/053254, dated Apr. 13, 2017.

Extended European Search Report for European Application No. 16797298.3, dated Dec. 3, 2018.

International Search Report and Written Opinion for International Application No. PCT/US2016/033270, dated Aug. 25, 2016.

International Preliminary Report on Patentability for International Application No. PCT/US2016/033270, dated Nov. 30, 2017.

Bernardini et al., Spontaneous polarization and piezoelectric constants of III-V nitrides. Phys. Rev. B. 1997;56(16):R10024-7.

Bour et al., AlGaInN Mqw Laser Diodes. III-V Nitride Semiconductors Applications and Devices. E.T. Yu (Ed.). Taylor and Francis Books, Inc., New York, Ny, vol. 16, Chapter 10. 2003.

Bour et al., Design and performance of asymmetric waveguide nitride laser diodes. IEEE J Quantum Electron. 2000;36(2):184-191. doi: 10.1109/3.823464.

Choquette et al., Selective Oxidation of Buried AlGaAs for Fabrication of Vertical-Cavity Lasers. Conference: Spring meeting of the Materials Research Society (MRS), San Francisco, Ca, 1996 Apr 8-12. OSTI 244633. Jun. 1996 101 pages.

Eiting et al., Growth of low resistivity p-type GaN by metal organic chemical vapour deposition. Electron Lett. 1997 Nov 6;33(23):1987-1989. doi: 10.1049/e1.19971257.

Gautier et al., Observations of Macroporous Gallium Nitride Electrochemically Etched from High Doped Single Crystal Wafers in Hf Based Electrolytes. Ecs J of Solid State Science and Technology. 2013;2(4):P146-P148.

(56) References Cited

OTHER PUBLICATIONS

Jeon et al., Investigation of Mg doping in high-Al content p-type Al x Ga 1-x N (0.3<x<0.5). Appl Phys Lett. 2005;86:082107. doi: 10.1063/1.1867565.
Jiang et al., Semiconductor lasers: Expanding into blue and green. Nat Photon. 2011;5:521-2.
Kozodoy et al., Enhanced Mg doping efficiency in Al 0.2 Ga 0.8 N/GaN superlattices. Appl Phys Lett. 1999;74:3681. doi: 10.1063/1.123220.
Laino et al., Substrate Modes of (Al,In)GaN Semiconductor Laser Diodes on SiC and GaN Substrates. IEEE J Quantum Electron. 2007;43(1):16-24. doi: 10.1109/JQE.2006.884769.
Lin et al., Current steering effect of GaN nanoporous structure. Thin Solid Films. Nov. 2014.;570(Part B):293-7.
Nagahama et al., High-Power and Long-Lifetime InGaN Multi-Quantum-Well Laser Diodes Grown on Low-Dislocation-Density GaN Substrates. Jpn J Appl Phys. 2000;39, part 2(7a):L647. doi: 10.1143/JJAP.39.L647.
Nakamura et al., The Blue Laser Diode: The Complete Story. Springer. 2000. pp. 24-8, 237-9.
Nakayama et al., Electrical Transport Properties of p-GaN. Jpn J Appl Phys. 1996;35, Part 2(3A):L282. doi: 10.1143/Jjap.35.L282.
Okamoto et al., Pure Blue Laser Diodes Based on Nonpolar m-Plane Gallium Nitride with InGaN Waveguiding Layers. Jpn J Appl Phys. 2007;46:L820. doi: 10.1143/JJAP.46.L820.
Pandey et al., Formation of self-organized nanoporous anodic oxide from metallic gallium. Langmuir. 2012;28(38):13705-11.
Park et al., Doping selective lateral electrochemical etching of GaN for chemical lift-off. Jun. 5, 2009. Applied Physics Letters. AIP Publishing LLC, US. vol. 94(22) pp. 221907-1-221907-3.
Park et al., High Diffuse Reflectivity of Nanoporous GaN Distributed Bragg Reflector Formed by Electrochemical Etching. Applied Physics Express. Jun. 14, 2013;6(7):072201-1-4.
Piprek, Efficiency droop in nitride-based light-emitting diodes. Physica Status Solidi A. Oct. 2010;207(10):2217-25.
Pourhashemi et al., High-power blue laser diodes with indium tin oxide cladding on semipolar (202 _ 1 _ ) GaN substrates. Appl Phys Lett. 2015;106:111105.
Ruoyuan et al., Wet oxidation of AlGaAs/GaAs distributed Bragg reflectors. Chin J Semiconductors. Aug. 2005;26(8):1519-23.
Sarzynski et al., Elimination of AlGaN epilayer cracking by spatially patterned Ain mask. Appl Phys Lett. 2006;88:121124.
Tanaka et al., p-type conduction in Mg-doped GaN and Al0.08Ga0.92N grown by metalorganic vapor phase epitaxy. Appl Phys Lett. 1994;65:593. doi: 10.1063/1.112309.
Todt et al., Oxidation kinetics and microstructure of wet-oxidized Mbe-grown short-period AlGaAs superlattices. Mat Res Soc Symp Proc. 2002;692:561-6.
Vajpeyi et al., High Optical Quality Nanoporous GaN Prepared by Photoelectrochemical Etching. Electrochemical and Solid-State Letters. 2005;8(4):G85-8.
Waldrip et al., Stress engineering during metalorganic chemical vapor deposition of AlGaN/GaN distributed Bragg Reflectors. Appl Phys Lett. 2001;78:3205.
Wierer et al., Comparison between blue lasers and light-emitting diodes for future solid-state lighting. Laser Photonics Rev. Nov. 2013;7(6):963-93.
Yam et al., Porous GaN prepared by Uv assisted electrochemical etching. Thin Solid Films. Elsevier, Amsterdam, NL, Feb. 15, 2007; vol. 515(7-8), pp. 3469-3474.
Zhang et al., Confinement factor and absorption loss of AllnGaN based laser diodes emitting from ultraviolet to green. J Appl Phys. 2009;105:023104.
Zhang et al., Mesoporous GaN for Photonic Engineering-Highly Reflective GaN Mirrors as an Example. ACS Photonics. 2015;2(7):980-6.
Zheng et al., Synthesis of Ultra-Long and Highly Oriented Silicon Oxide Nanowires from Liquid Alloys. Adv Mater. Jan. 2002;14(2):122-4.
Amano et al., I. P-type conduction in Mg-doped GaN treated with low-energy electron beam irradiation (LEEBI). Japanese Journal of Applied Physics. Dec. 1989;28(12A):L2112.
Beale et al., An experimental and theoretical study of the formation and microstructure of porous silicon. Journal of Crystal Growth. Dec. 1, 1985;73(3):622-36.
Chichibu et al., Origin of defect-insensitive emission probability in In-containing (Al, In, Ga) N alloy semiconductors. Nature materials. Oct. 2006;5(10):810-6.
Kuwano et al., Lateral hydrogen diffusion at p-GaN layers in nitride-based light emitting diodes with tunnel junctions. Japanese Journal of Applied Physics. Aug. 20, 2013;52(8S):08JK12.
Lee et al., Fast fabrication of long-range ordered porous alumina membranes by hard anodization. Nature materials. Sep. 2006;5(9):741-7.
Lee et al., Optically pumped GaN vertical cavity surface emitting laser with high index-contrast nanoporous distributed Bragg reflector. Optics express. May 4, 2015;23(9):11023-30.
Mynbaeva et al., Strain relaxation in GaN layers grown on porous GaN sublayers. Materials Research Society Internet Journal of Nitride Semiconductor Research. 1999;4(1).
Mynbaeva et al., Structural characterization and strain relaxation in porous GaN layers. Applied Physics Letters. Feb. 28, 2000;76(9):1113-5.
Schwab et al., Aligned mesopore arrays in GaN by anodic etching and photoelectrochemical surface etching. The Journal of Physical Chemistry C. Aug. 22, 2013;117(33):16890-5.
Searson et al., Pore morphology and the mechanism of pore formation in n-type silicon. Journal of applied physics. Jul. 1, 1992;72(1):253-8.
Sharizal et al., Effect of oxide aperture on the performance of 850 nm vertical-cavity surface-emitting lasers. Optik. Jan. 1, 2009;120(3):121-6.
Smith et al., a theoretical model of the formation morphologies of porous silicon. Journal of Electronic Materials. Nov. 1, 1988;17(6):533-41.
Smith et al., Porous silicon formation mechanisms. Journal of Applied Physics. Apr. 15, 1992;71(8):R1-22.
Wang et al., Fabrication and properties of nanoporous GaN films. Applied physics letters. Aug. 2, 2004;85(5):816-8.
Yang et al., Improving light output power of InGaN-based light emitting diodes with pattern-nanoporous p-type GaN: Mg surfaces. Applied Physics Letters. Nov. 17, 2008;93(20):203103.
Yuan et al., Optical engineering of modal gain in a III-nitride laser with nanoporous GaN. ACS Photonics. Sep. 21, 2016;3(9):1604-10.
Zhang et al., a resonant-cavity blue—violet light-emitting diode with conductive nanoporous distributed Bragg reflector. physica status solidi (a). Aug. 2017;214(8):1600866.
Zhang et al., Toward quantitative electrochemical nanomachining of Iii-nitrides. Journal of the Electrochemical Society. Jul. 28, 2018;165(10):E513-20.
Zhang, Mechanism of pore formation on n-type silicon. Journal of the Electrochemical Society. Dec. 1, 1991;138(12):3750-6.
Al-Heuseen et al., Effect of different electrolytes on porous GaN using photo-electrochemical etching. Applied surface science. May 1, 2011;257(14):6197-201.
Beale et al., Microstructure and formation mechanism of porous silicon. Applied Physics Letters. Jan. 1, 1985;46(1):86-8.
Bisi et al., Porous silicon: a quantum sponge structure for silicon based optoelectronics. Surface science reports. Apr. 1, 2000;38(1-3):1-126.
Chen et al., High-Q, Low-Threshold Monolithic Perovskite Thin-Film Vertical-Cavity Lasers. Advanced Materials. Apr. 2017;29(16):1604781.
Choquette et al., Vertical-cavity surface emitting lasers: moving from research to manufacturing. Proceedings of the IEEE. Nov. 1997;85(11):1730-9.
Cullis et al., The structural and luminescence properties of porous silicon. Journal of applied physics. Aug. 1, 1997;82(3):909-65.
Davis et al., Ordered porous materials for emerging applications. Nature. Jun. 2002;417(6891):813-21.

(56) References Cited

OTHER PUBLICATIONS

Feng et al., Genetic history of Xinjiang's Uyghurs suggests bronze age multiple-way contacts in Eurasia. Molecular Biology and Evolution. Oct. 1, 2017;34(10):2572-82.

Foll et al., Macroporous semiconductors. Materials. May 2010;3(5):3006-76.

Gautier et al., Porous silicon in microelectronics: From academic studies to industry. ECS Transactions. Sep. 18, 2015;69(2):123.

Hamaguchi et al., Milliwatt-class GaN-based blue vertical-cavity surface-emitting lasers fabricated by epitaxial lateral overgrowth. physica status solidi (a). May 2016;213(5):1170-6.

Han et al., Single-Crystalline, Nanoporous Gallium Nitride Films With Fine Tuning of Pore Size for Stem Cell Engineering. Journal of Nanotechnology in Engineering and Medicine. Nov. 1, 2014;5(4):040903-1.

Huang et al., Mechanical properties of nanoporous GaN and its application for separation and transfer of GaN thin films. ACS Applied Materials & Interfaces. Nov. 13, 2013;5(21):11074-9.

Jasim et al., the Size Effect in Small Aperture Confined Vertical Cavity Surface Emitting Laser. AIP Conference Proceedings. Jun. 1, 2009;1136(1):103-7.

Kuramoto et al., Enhancement of slope efficiency and output power in GaN-based vertical-cavity surface-emitting lasers with a $SiO_2$-buried lateral index guide. Applied Physics Letters. Mar. 12, 2018;112(11):111104.

Langa et al., Waveguide structures based on porous indium phosphide. Electrochemical and Solid State Letters. Dec. 23, 2004;8(2):C30.

Lee et al., Enhanced performance of InGaN/GaN multiple-quantum-well light-emitting diodes grown on nanoporous GaN layers. Optics Express. Jun. 30, 2014;22(104):A1164-73.

Lin et al., Fabrication of current confinement aperture structure by transforming a conductive GaN: Si epitaxial layer into an insulating $GaO_x$ layer. ACS Applied Materials & Interfaces. Dec. 24, 2014;6(24):22235-42.

Zhang, Nanoporous GaN and Its Application in Vertical-Cavity Surface-Emitting Lasers. Yale University PhD Dissertation. May 2019:248 pages.

\* cited by examiner

METHOD TO MAKE BURIED, HIGHLY CONDUCTIVE P-TYPE III-NITRIDE LAYERS

CROSS REFERENCE TO RELATED APPLICATION

This application claims the benefit of U.S. Provisional Application No. 62/086020, filed Dec. 1, 2014, titled "A Method to Make Buried, Highly Conductive P-Type III-Nitride Layers," which is hereby incorporated by reference in its entirety.

BACKGROUND

Technical Field

The technology relates to III-nitride integrated devices that include p-type layers having neutralizing atomic species bound to acceptors.

Discussion of the Related Art

Gallium-nitride crystals were produced at the end of the 1960s by growing GaN on a substrate using a hydride vapor phase epitaxy (HVPE) technique. In the 1970s, new crystal-growth techniques were developed for growing semiconductors on substrates. These new techniques included molecular beam epitaxy (MBE) and metalorganic vapor phase epitaxy (MOVPE) which is also known as metalorganic chemical vapor deposition (MOCVD). For each of these techniques, an epitaxial layer may be doped with donor or acceptor atoms as the layer is formed to create n-type or p-type conductive layers.

During the growth of p-type III-nitride layers using MOVPE or HVPE techniques, any available hydrogen may form complexes with an acceptor dopant, such as magnesium (Mg). The resulting Mg—H complexes can neutralize the acceptor and cause hole compensation. This can lead to a high resistivity of a p-type, gallium-nitride layer. A high resistivity of a p-type layer may limit device performance. For example, a highly resistive p-type layer may reduce an operating speed of a transistor or diode.

The winners of the 2014 Nobel Prize in Physics—Isamu Akasaki, Hiroshi Amano and Shuji Nakamura—made major discoveries in p-doping gallium-nitride material during the late 1980s and early 1990s. Amano, Akasaki, and co-workers observed that when Mg-doped gallium-nitride is irradiated with low energy electrons, the electron beams dissociate the acceptor-H complexes and activate the acceptors. The discovery resulted in better p-doping properties. Subsequently, Shuji Nakamura showed that a thermal treatment (annealing) can dissociate the atomic hydrogen from the acceptor-H neutral complexes. Following these developments, heterojunctions in blue light-emitting diodes (LEDs) were realized in the early 90s in both Akasaki's and Nakamura's research groups.

SUMMARY

Methods and structures relating to the formation of highly-conductive, p-type layers in III-nitride integrated devices are described. One or more conductive, porous layers may be formed adjacent to a p-type layer. The porous layer can provide a pathway for hydrogen from the p-type layer to diffuse out of the device during an annealing step. By allowing hydrogen to escape from a p-type layer, a larger number of acceptor dopants may be activated, thereby reducing the resistance of the p-type layer. The porous layers may remain highly conductive and be incorporated as active layers into diodes, transistors, light-emitting diodes, and laser diodes, among other devices.

Some of the described embodiments relate to an integrated device comprising a substrate, a first n-type layer formed adjacent to the substrate from III-nitride material, a first p-type layer formed from III-nitride material, and a first conductive, porous layer formed from III-nitride material and located adjacent to the first p-type layer. A portion of the first conductive, porous layer may be exposed to an ambient.

Some embodiments relate to methods for fabricating an integrated device. A method may comprise acts of forming a first n-type layer on a substrate from III-nitride material, forming a first p-type layer adjacent to the first n-type layer from III-nitride material, and forming a first conductive, porous layer adjacent to the first p-type layer from III-nitride material. A portion of the first conductive, porous layer may be exposed to an ambient, so that neutralizing species bound to dopants in a buried p-type layer may out-diffuse during a subsequent annealing step.

The foregoing apparatus and method embodiments may be included in any suitable combination with aspects, features, and acts described above or in further detail below. These and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures. Where the drawings relate to microfabricated devices, only one device may be shown to simplify the drawings. In practice, a large number of devices may be fabricated in parallel across a large area of a substrate or entire substrate. Additionally, a depicted device may be integrated within a larger circuit.

When referring to the drawings in the following detailed description, spatial references "top," "bottom," "upper," "lower," "vertical," "horizontal," and the like may be used. Such references are used for teaching purposes, and are not intended as absolute references for embodied devices. An embodied device may be oriented spatially in any suitable manner that may be different from the orientations shown in the drawings. The drawings are not intended to limit the scope of the present teachings in any way.

Features and advantages of the illustrated embodiments will become more apparent from the detailed description set forth below when taken in conjunction with the drawings.

DETAILED DESCRIPTION

Figure 1:
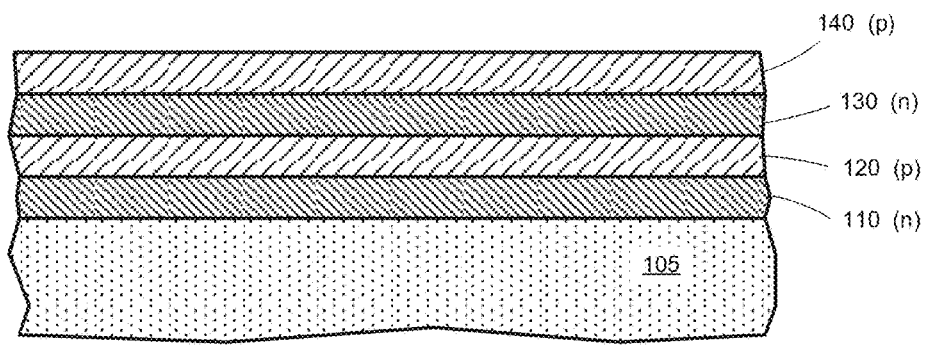
FIG. 1 depicts, in elevation view, a cascaded pn semiconductor structure comprising III-nitride materials.

The inventors have recognized and appreciated that, in some cases, conventional, p-type, III-nitride layers (such as Mg-doped AlInGaN) that are formed using MOCVD or HYPE still suffer from a low dopant activation percentage and exhibit reduced p-type conductivity. Low dopant activation is more noticeable for integrated devices in which an acceptor-doped layer is embedded underneath one or several other layers in an epitaxy structure, such as a multilayer stack depicted in FIG. 1. The structure 100 in FIG. 1 includes cascaded pn junctions formed on a substrate 105, and may be used for a III-nitride tandem solar cell, for example. Even though a thermal annealing step may be used during the fabrication process, the inventors have recognized and appreciated that hydrogen cannot easily diffuse from a buried p-type layer 120 through the upper layers 130, 140 and be released into an ambient.

Although hydrogen could diffuse laterally along a p-type layer 120, the inventors have recognized that the efficiency of lateral diffusion is very low. For example, lateral diffusion and hydrogen release is limited by the diffusion length of hydrogen in the semiconductor (on the order of 1 micron) as well as the small size of the sidewalls, through which hydrogen may escape. Since hydrogen may not be able to diffuse out of the structure, most of the p-type layer may remain un-activated and highly resistive. Accordingly, conventional post-growth thermal annealing may not be able to make buried p-type layers as conductive as desired for a particular integrated circuit application.

Figure 2:
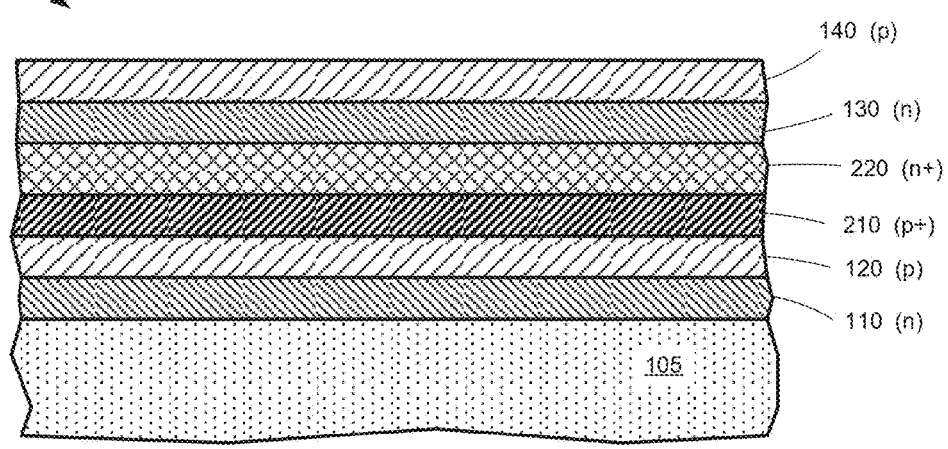
FIG. 2 depicts a cascaded pn semiconductor structure that includes a porous III-nitride layer to facilitate release of hydrogen, according to some embodiments.

According to some embodiments and referring to FIG. 2, a multilayer structure 200 that allows out-diffusion of hydrogen from one or more buried p-type layers 120, 210 includes one or more porous III-nitride layers 220. The multilayer structure may be formed on a substrate 105 (e.g., a sapphire, ceramic, silicon, or any suitable substrate), and may include a first n-type layer 110 that is epitaxially grown over the substrate 105. The structure may further include a first p-type layer 120, a second n-type layer 130, and a second p-type layer 140 formed by epitaxial growth (e.g., via MOCVD or HYPE). The n and p-type layers may comprise one or more III-nitride materials (e.g., GaN, AlGaN, AlN, InGaN, AlInGaN, etc.). Some structures may include one or more additional intervening layers (not shown) at one or more layer interfaces. For example, a thin (~10 nm) buffer layer of AlN may be formed between the substrate 105 and the first n-type layer 110.

In some embodiments, a highly-doped p-type layer 210 may be located adjacent to a buried p-type layer 120 using epitaxial growth techniques. The highly-doped p-type layer 210 may comprise a III-nitride material, and provide a tunneling barrier between the two cascaded pn junctions that are formed by layers 140, 130 and layers 120, 110. For example, the highly-doped p-type layer 210 may be used to form a tunnel junction diode or tunnel junction light-emitting diode. According to some embodiments, the highly-doped p-type layer may have a doping density between approximately $5 \times 10^{18}$ cm$^{-3}$ and approximately $5 \times 10^{19}$ cm$^{-3}$. A thickness of the highly-doped p-type layer 210 may be between approximately 20 nm and approximately 1000 nm. In some implementations, the highly-doped p-type layer 210 may not be included.

The term "adjacent" may be used to describe two proximal layers that physically contact each other. In some cases, "adjacent" layers may be separated by one or more layers having a total thickness less than approximately 2 microns.

A highly doped, porous n-type layer 220 may be located adjacent to the highly-doped p-type layer 210 and the buried p-type layer 120. The porous n-type layer 220 may be formed initially as a non-porous layer. For example, the layer may be formed by epitaxial growth using MOCVD or HYPE techniques. The layer may be etched subsequently to form the porous n-type layer 220. According to some embodiments, the porous layer may comprise any suitable III-nitride material with a doping density between approximately $5 \times 10^{18}$ cm$^{-3}$ and approximately $2 \times 10^{20}$ cm$^{-3}$. A thickness of the porous n-type layer 220 may be between approximately 10 nm and approximately 2000 nm, though larger thicknesses may be used in some implementations.

According to some embodiments, a thermal annealing step may be carried out as part of a device-fabrication process. The annealing step may dissociate hydrogen from hydrogen-acceptor complexes in the p-type layer 120 and the highly-doped p-type layer 210. Some of the dissociated hydrogen may diffuse vertically to the porous layer 220. In the porous layer, the lateral diffusion rate for the hydrogen atoms may increase significantly, so that the hydrogen may readily diffuse out of the multilayer structure 200. For example, the porous layer 220 provides air ducts which allow the hydrogen atoms to diffuse out of the structure. By allowing out-diffusion of hydrogen, a resistivity of the p-type layer 120 may be reduced to a value lower than that obtained for buried p-type layers formed with conventional microfabrication techniques. For example, for a given dopant density and same layer geometry, a total resistance of a buried p-type layer which has undergone thermal out-diffusion of acceptor-bound atomic species via a porous layer may be between 10% and 30% lower than a total resistance of a conventionally-fabricated buried p-type layer. In some embodiments, a total resistance of an out-diffused buried p-type layer may be between 5% and 25% lower than a total resistance of a conventionally-fabricated buried p-type layer, though changes in total resistance may be greater or less that these values in other implementations. In some embodiments, a total resistance of an out-diffused buried p-type layer may be between 20% and 40% lower than a total resistance of a conventionally-fabricated buried p-type layer. In some embodiments, a total resistance of an out-diffused buried p-type layer may be between 30% and 50% lower than a total resistance of a conventionally-fabricated buried p-type layer.

Figure 3:
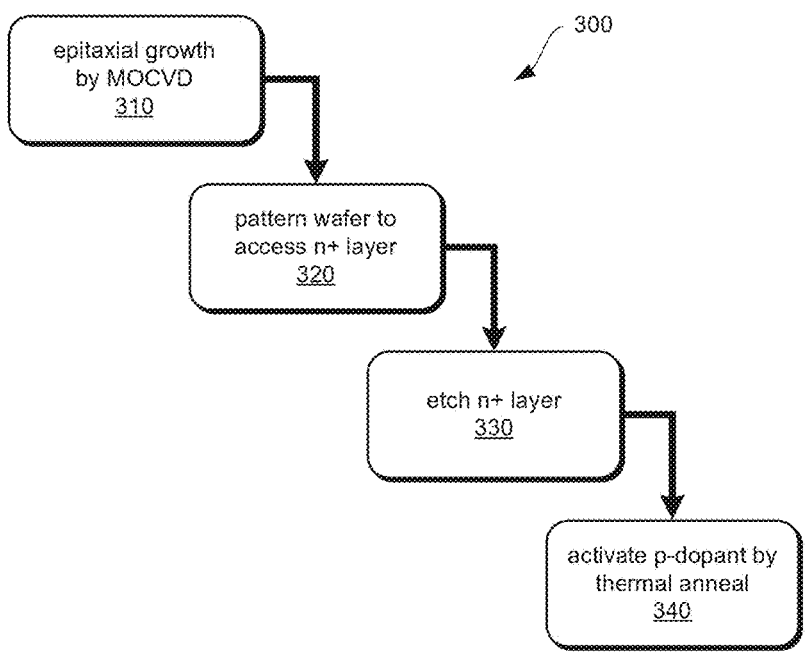
FIG. 3 depicts an embodiment of a method for fabricating a III-nitride integrated device that includes a porous layer.

FIG. 3 illustrates some process steps associated with a method 300 of fabricating a multilayer, III-nitride structure that includes a buried porous layer, according to some embodiments. Structures associated with a method for fabricating a multilayer, III-nitride structure are depicted in FIG. 4A-FIG. 7. A method 300 may comprise an act of epitaxially growing (act 310) a plurality of III-nitride layers on a substrate 105. The plurality of layers may include one or more buried p-type layers, and one or more buried $n^+$-type layers formed adjacent to the buried p-type layers. Dopants for the p-type layers may include magnesium (Mg), and a dopant density for these layers may be between approximately $5 \times 10^{18}$ cm$^{-3}$ and approximately $5 \times 10^{19}$ cm$^{-3}$ for the grown layer. Dopants for the $n^+$-type layers may include silicon (Si) and/or germanium (Ge), and a dopant density for these layers may be between approximately $5 \times 10^{18}$ cm$^{-3}$ and approximately $2 \times 10^{20}$ cm$^{-3}$. In some implementations, dopant densities for other n-type layers 110, 130 in the multilayer stack may be at least a factor of 5 less than a doping density for the highly doped $n^+$-type layer 215. The disparity in doping levels for the n-type layers and $n^+$-type layers provides etch selectivity of the $n^+$-doped layers over the n-doped layers in a subsequent electrochemical etching process (described below).

Figure 4A:
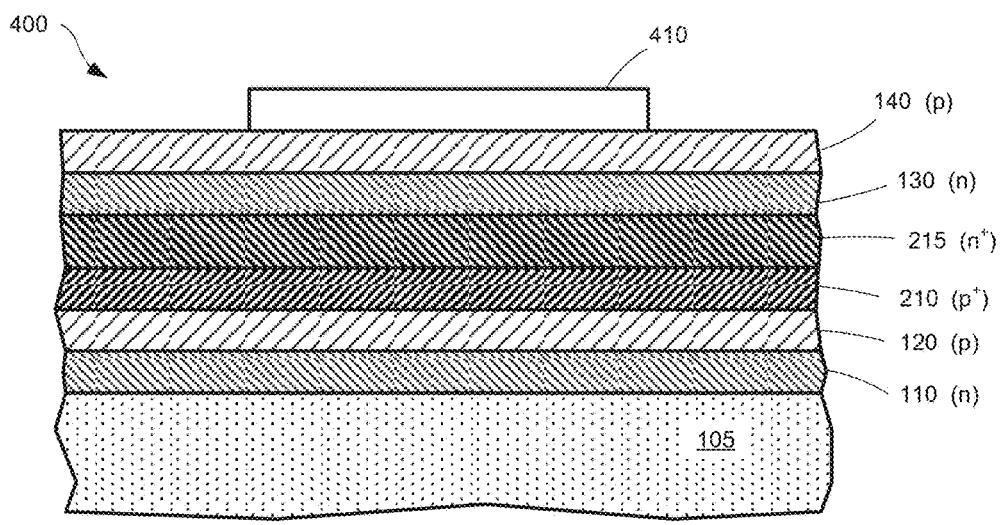
FIG. 4A depicts a structure associated with a method for fabricating a III-nitride integrated device that includes a porous layer, according to some embodiments.

A method 300 may further include an act of patterning a wafer or substrate (act 320) to access surface regions of the $n^+$-doped layer 215. The act of patterning may comprise forming one or more hard masks 410 over the multilayer stack 400. In some embodiments, the hard mask 410 may be deposited as a continuous film over the multilayer structure using a physical deposition process (e.g., electron-beam evaporation or sputtering), or may be deposited using a chemical vapor deposition process (e.g., plasma enhanced chemical vapor deposition). The hard mask may then be patterned using conventional photolithography techniques to form discrete structures 410 as depicted in FIG. 4A. For example, a positive or negative photoresist may be applied to the wafer over the continuous hard mask layer. The photoresist may be patterned using a photomask and optical exposure to selectively expose portions of the photoresist layer. The photoresist may be developed, and wet or dry etching may be used to pattern the hard mask layer.

In some implementations, a hard mask 410 may comprise an oxide (e.g., $SiO_x$), a nitride ($Si_xN_y$), or any other suitable inorganic material or material combination that exhibits etch selectivity over the underlying III-nitride layers. A thickness of the hard mask 410 may be between approximately 100 nm and approximately 400 nm. The hard mask 410 may be used to transfer a pattern into the underlying multilayer stack. The hard mask may also be used to protect the top surface of the upper-most layer (e.g., p-type layer 140) from exposure to an etchant that is used to form the porous layer 220.

Figure 4B:
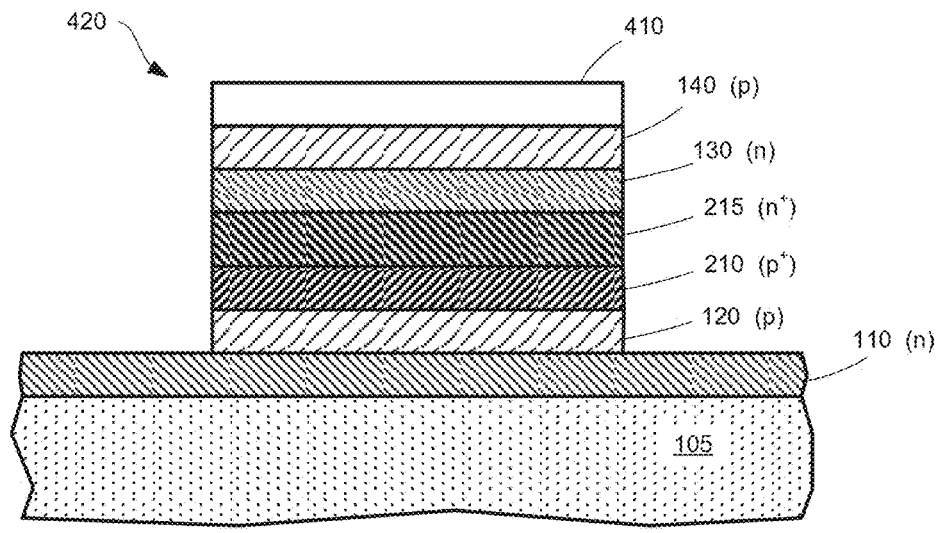
FIG. 4B depicts a structure associated with a method for fabricating a III-nitride integrated device that includes a porous layer, according to some embodiments.

The act of patterning the wafer or substrate (act 320) may also include a process for etching the underlying III-nitride layers that are not covered or protected by the hard mask 410, as depicted in FIG. 4B. According to some embodiments, a chlorine-based chemistry may be used to dry-etch the III-nitride layers. For example, an anisotropic, inductively-coupled plasma (ICP) etch or anisotropic reactive-ion etch (RIE) using a Cl-based etching recipe may be employed to selectively remove portions of the III-nitride layers. The dry etching depth should extend beyond the $n^+$-type layer 215, so that one or more sidewalls of the $n^+$ layer are exposed for a subsequent electrochemical etching process.

According to some embodiments, the dry etching depth should not extend through the n-type layer 110. The n-type layer may serve as a current-spreading layer during the subsequent electrochemical etching. Accordingly, it is desirable that this layer be continuous, so that electrical current for etching can be spread across the entire etching region, which may be a majority or nearly all of a wafer.

In some implementations, the resulting etched structure 420 may form a mesa for a discrete device (e.g., a tandem photodiode, a transistor, a tunnel-junction LED, etc.), as depicted in FIG. 4B. In other embodiments, hard masks 410 having other patterns may be used. For example, in some cases trenches or holes may be formed in the substrate to access sidewalls of the $n^+$-layer 215.

Figure 4C:
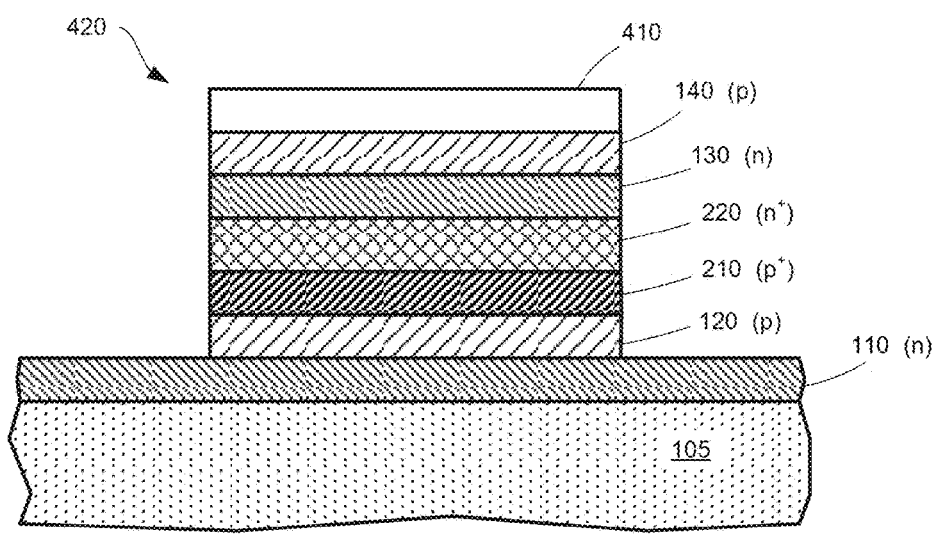
FIG. 4C depicts a structure associated with a method for fabricating a III-nitride integrated device that includes a porous layer, according to some embodiments.

Referring again to FIG. 3, a method 300 for fabricating a multilayer, III-nitride structure that includes a buried porous layer may further include etching (act 330) an $n^+$-type layer to form a nanoporous layer. For example, the multilayer structure 420 may subsequently be electrochemically etched in a concentrated etchant or electrolyte. In some embodiments, the electrolyte may be nitric acid ($HNO_3$). Other etchants may be used in other embodiments. According to some embodiments, the concentrated nitric acid may be between approximately 15 M and approximately 18 M. In some cases, the concentrated nitric acid may be between 50% and approximately 80% by weight in water. The electrochemical (EC) etching may be carried out at room temperature, and does not require ultraviolet light to aid in the etching process, as is the case for photoelectrochemical (PEC) etching. An electrical bias may be applied between the substrate (e.g., the n-type layer 110) and the electrolyte to convert the $n^+$-layer 215 to a porous layer 220, as depicted in FIG. 4C.

Apparatus for electrochemical etching may comprise an electrolyte bath, into which one or more wafers may be placed, electrodes for contacting the electrolyte and the one or more wafers, and an electrical power supply for applying a voltage across the electrodes. The EC etching apparatus may be similar to that described in U.S. patent application Ser. No. 13/559,199, filed Jul. 26, 2012, which is incorporated herein by reference. The EC etching may be carried out with a bias on the electrodes between 1 volt and 10 volts. In some cases, the bias voltage is held to an approximately constant value throughout the etch (e.g., current supplied to the electrolyte may be controlled to maintain an approximately constant voltage between the electrolyte and sample being etched). The EC etching may proceed laterally from exposed side-walls of the $n^+$-layer 215 into the layer and continue until the layer 215 is porosified. In some implementations, the EC etch may be a timed etch. The porification of highly-doped n-type layer 215 creates a large number of interconnected pores. These pores effectively provide free space pathways or channels, so that hydrogen can readily diffuse into the pores and out to the ambient.

In some implementations, concentrated nitric acid at approximately 16.7 M or 70% by weight may be used to anodize the $n^+$-layer 215. The inventors have determined etching properties of GaN for concentrated nitric acid under various etching conditions, and the results are summarized in FIG. 5. To obtain these results, doping concentration in GaN and applied bias for EC etching were varied.

Figure 5:
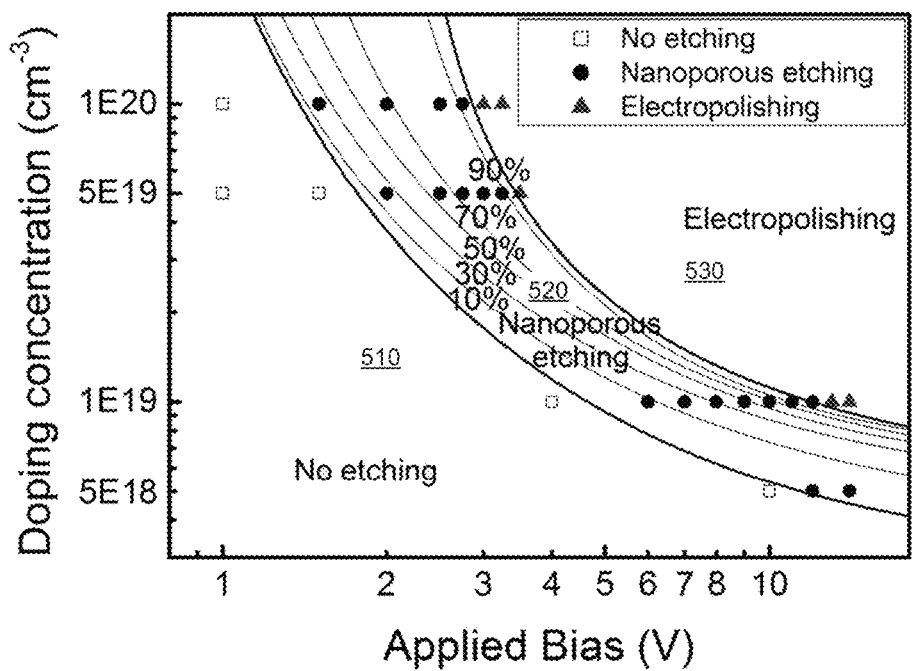
FIG. 5 illustrates electrochemical etching conditions, according to some embodiments.

The plot of FIG. 5 indicates that there are three regions 510, 520, 530 that exhibit different etching properties. In the first region 510, no etching occurs. In the second region 520, the EC etching produces a nanoporous structure from the III-nitride material. In the third region 530, the EC etching completely removes the III-nitride material. The etching characteristics are determined by a combination of electrolyte, n+ doping level, and applied bias voltage during EC etching.

When a positive anodic bias is applied to an n+-type GaN sample immersed in an acidic electrolyte, the n+-GaN can become oxidized by holes that accumulate at a surface inversion layer of the GaN sample. The resulting surface oxide layer may be subsequently dissolved by the electrolyte. When the applied bias and/or the doping concentration is low, no chemical reactions occur and the n+-GaN remains unetched (region 510). As the applied bias and/or the doping concentration increases, electrostatic breakdown occurs with the injection of holes to certain localized hot spots. This results in the formation of nanoporous structures (region 520). At an even higher applied bias and/or higher doping concentrations, electro-polishing (complete etching or removal of the GaN) takes place (region 530). The EC etching is conductivity selective, so that p-type layers and lightly doped ($n<5\times10^{18}$ cm$^{-3}$) n-type layers will not be porosified.

Within the nanoporous region 520, the inventors have determined that the pore morphology can be controlled by the sample conductivity and the anodic bias. A higher doping level facilitates the formation of high curvature and smaller meso-pores, and the threshold bias of porosification is reduced accordingly. By varying the doping concentration of an n+-type layer from about $1\times10^{20}$ cm$^{-3}$ to about $1\times10^{19}$ cm$^{-3}$ and varying the EC etching bias between about 1 volt and about 12 volts, the resulting pore morphology can be varied from microporous (pore diameter d~10 nm) to mesoporous (d~30 nm), and to macroporous (d~50 nm). With reference to FIG. 5, the microporous region is located in approximately an upper third of the nanoporous region 520, and the macroporous region is located in approximately a lower third of the nanoporous region 520. Further, for a given doping concentration, the EC bias can be adjusted to alter the percent porosity of the cladding layer, as is depicted by the contour lines in the nanoporous region 520 of the plot. The porosity percentage is defined as an amount of vacant volume of a porous sample divided by a total volume occupied by the porous sample.

In some embodiments, a majority of pore diameters (measured transverse to the pore channels) are between approximately 20 nm and approximately 150 nm, and a porosity is between approximately 10% and approximately 90%. In some implementations, a majority of pore diameters in the porous layer 220 are between approximately 20 nm and approximately 100 nm, and a porosity is between approximately 10% and approximately 90%. In some cases, out-diffusion of hydrogen may be sufficient with low porosity, so that a porosity of the porous layer may be between approximately 10% and approximately 50%.

Figure 6:
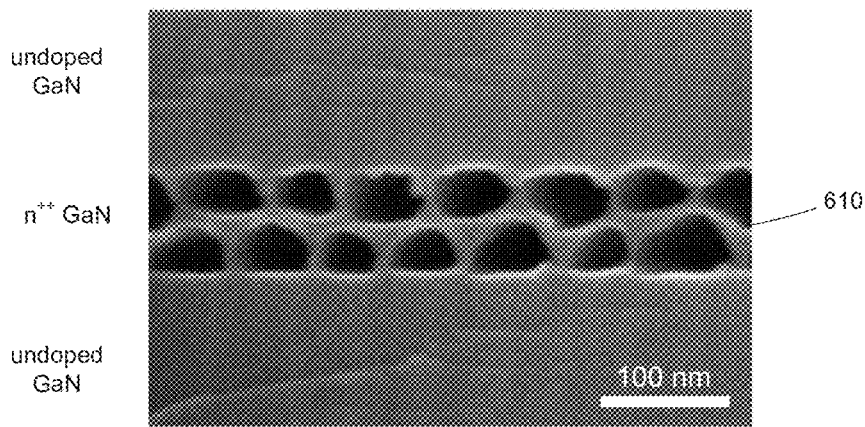
FIG. 6 is a scanning-electron micrograph showing a conductive, porous gallium-nitride layer that has been etched between two undoped gallium-nitride layers.

FIG. 6 is a scanning electron microscope (SEM) image showing a porosified n++ GaN layer 610 after electrochemical etching. The pores appear as dark spots and are distributed substantially uniformly throughout the porous layer. For this example, the n++ layer was formed between two undoped GaN layers. In other embodiments, the porous layer may be formed adjacent to active layers in a multilayer stack, as depicted in FIG. 4C.

In terms of electrical resistance, the inventors have determined that resistivity of a nanoporous III-nitride layer scales monotonically with the porosity. Since an n+ layer may be initially doped above $5\times10^{19}$ cm$^{-3}$ before porosification, even with a porosity of 40% the carrier concentration level of the nanoporous layer remains above $2\times10^{18}$ cm$^{-3}$. Such a high carrier concentration yields a negligible resistivity for a porous III-nitride layer. Accordingly, a nanoporous layer 220 retains high conductivity, so that it does not significantly alter performance of a device manufactured from the multilayer structure 420. In some embodiments, a nanoporous III-nitride layer 220 remains highly n-type and may comprise an active portion of an integrated device.

After forming the nanoporous layer 220, the hard mask 410 (see FIG. 4C) may be removed from the multilayer structure 420. In some implementations, the hard mask comprises $SiO_2$, and may be removed using a wet buffered oxide etch (BOE). In other embodiments, a dry etch may be used to remove the hard mask 410.

Referring again to FIG. 3, a method 300 for fabricating a multilayer, III-nitride structure that includes a buried porous layer may further include thermally annealing (act 340) a sample or wafer that includes one or more buried porous layers. According to some embodiments, a sample or wafer may be annealed at a temperature between approximately 600° C. and approximately 800° C., though other values may be used in other embodiments. The anneal time may be dependent upon the size of the sample or wafer and upon pore morphology. For example, the anneal time may be as short as 1 minute, or may be as long as 5 to 10 hours. During the anneal, the ambient may comprise $N_2$ gas, $O_2$ gas, or air, though other gasses or combination of gasses may be used in other embodiments for the ambient.

Figure 7:
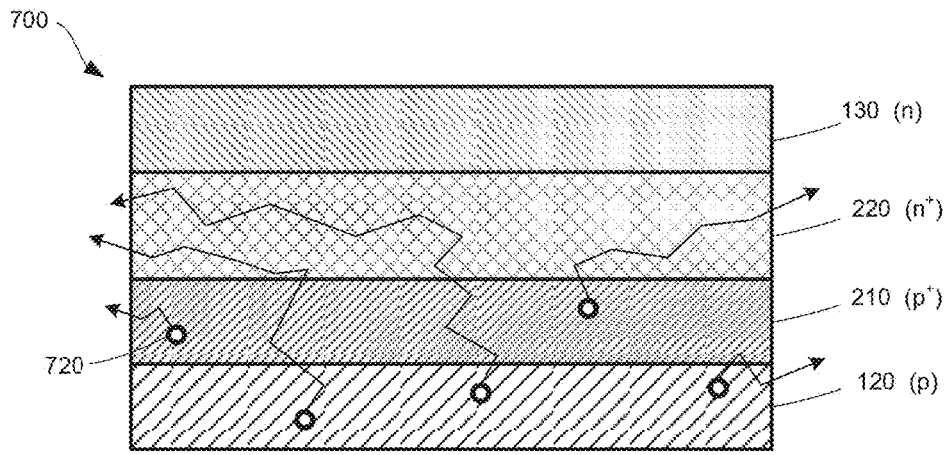
FIG. 7 illustrates outgassing of hydrogen atoms from buried p-type layers, according to some embodiments.

During a thermal annealing process, hydrogen 720 from hydrogen complexes in a p-type and/or p+-type layer may dissociate and diffuse to an edge of the layer or diffuse vertically to a nearby porous layer, as depicted in FIG. 7. The structure 700 in FIG. 7 depicts a portion of the mesa 420 of FIG. 4C, and various diffusion pathways are indicated by the solid lines with arrows. For example, hydrogen 720 in a buried p-type layer 120 may dissociate from a hydrogen-acceptor complex and diffuse laterally to an edge of the mesa and escape into an ambient. Additionally, hydrogen deeper within the structure 700 may dissociate and diffuse vertically through one or more layers until it reaches the porous layer 220. The hydrogen may then escape to the ambient through channels or ducts in the porous layer 220. Hydrogen 720 in an adjacent p+-type layer may similarly dissociate from hydrogen-acceptor complexes during annealing, diffuse, and escape into an ambient.

Unlike conventional methods that rely on lateral diffusion of hydrogen for buried p-type layers, the present embodiments include a nanoporous layer 220 that provides vertical (and then low-resistance lateral) pathways for removal of hydrogen from depths greater than about 1 micron within an integrated device. For vertical diffusion pathways, a total thickness of one or more layers formed between a p or p+-type layer and a porous layer may be between approximately 10 nm and approximately 1 micron, though in some cases a total thickness up to approximately 2 microns may be used. Because hydrogen exhibits a slow rate of diffusion in solid semiconductors for distances of approximately 1 micron and greater, it is preferable to keep a total thickness of intervening layers to less than approximately 1 micron. Removal of hydrogen from p or p+-type layers can lower the resistance of these layers and improve device performance.

In some implementations, fabrication steps described above may include processes that can be applied in existing chip foundries. For example, layer growth techniques (MOCVD) and etching techniques (RIE, inductively coupled plasma, wet etches) may comprise conventional techniques used in microfabrication facilities. In some embodiments, electrochemical etching to form porous III-nitride layers may be an inexpensive and environmental-friendly technique that is suitable for use in microfabrication facilities and compatible with high-volume production.

The foregoing techniques for forming porous layers and removing hydrogen from p or $p^+$-type layers may be implemented with different integrated device structures. The structure depicted in FIG. 4A-FIG. 4C is just one type of device for which the above-described techniques may be used. Other structures include, but are not limited to, tunnel junction LEDs, tandem photovoltaic systems, hetero-junction pnp or npn bipolar transistors, etc. III-nitride cascaded tunnel junction LEDs enable a repeated use of electrons and holes for photon generation, and these devices are being considered as a leading candidate to address the "droop" problem associated with LEDs. III-nitride tandem, photovoltaic systems that have multiple pn junctions offer a broad range of bandgaps that can potentially be adjusted to match a majority of the solar spectrum, so that the photovoltaic system can convert incident solar radiation more efficiently. In such systems, obtaining highly-conductive, embedded, p-type AlInGaN layers is important for improving device performance.

Some of the above-described techniques may also be used for other dopants that form complexes with neutralizing atoms, provided the complexes may be dissociated and the neutralizing atoms have an appreciable diffusion length (e.g., greater than 100 nm) in the III-nitride material. In some embodiments, alternative or additional methods may be used to dissociate complexes (e.g., UV illumination, electron-beam irradiation, high-field RF excitation, excitation in a plasma).

Figure 8:
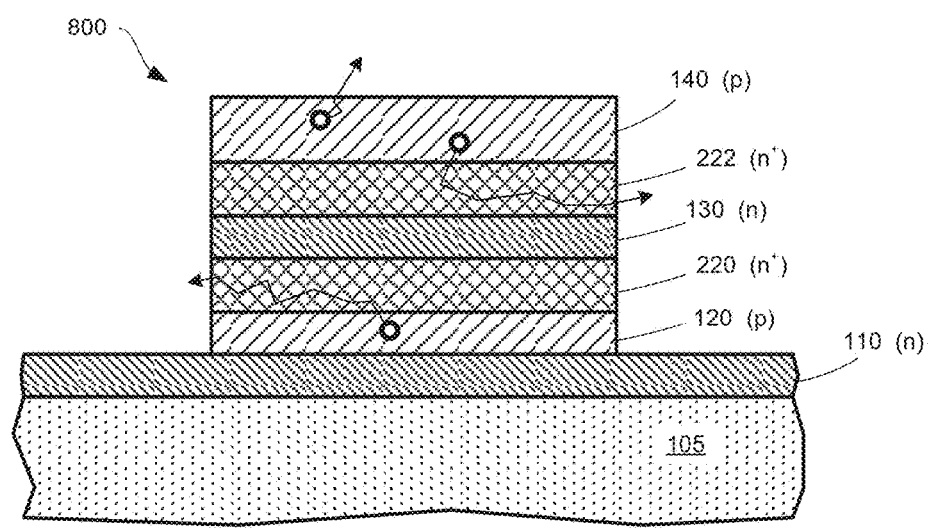
FIG. 8 illustrates a structure for a pnp device that includes two conductive, porous layers; according to some embodiments.

FIG. 8 depicts another embodiment of a multilayer structure 800 that may be formed in a device having tandem pn junctions or a pnp junction. In this structure, an n-type layer 130 is sandwiched between two p-type layers 120, 140. To activate dopants in the lower p-type layer 120, a first $n^+$-type porous layer 220 may be formed adjacent to the lower p-type layer. Another $n^+$-type porous layer 222 may be formed adjacent to the upper p-type layer 222. Both $n^+$ layers 220, 222 may be grown initially (before porification) using the same or similar growth conditions, so that the two separated layers have similar doping concentrations. Accordingly, both layers may be electrochemically etched at a same time using the same etching conditions to simultaneously porosify the layers. During a subsequent thermal annealing process, hydrogen from the lower p-type layer 120 may diffuse vertically to the porous $n^+$-type layer 220 and then escape to the ambient. Additionally, hydrogen from the top p-type layer 140 may diffuse vertically in opposite directions to be released to the ambient, as depicted by the diffusion pathways.

Figure 9:
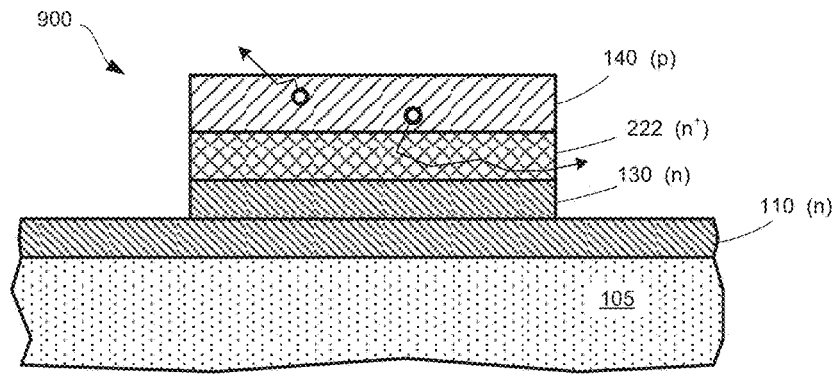
FIG. 9 depicts a variation of a device in which the p-type layer is located on a top side of the device.

FIG. 9 depicts another embodiment of a multilayer structure 900 that may be formed in a device having a pn junction, such as a diode, laser diode, or light-emitting diode. A porous $n^+$-type layer 222 may be formed adjacent to a p-type layer of the pn junction. In some embodiments, the p-type layer may be an upper layer of the structure, as depicted. During thermal annealing, hydrogen from the top p-type layer 140 may diffuse vertically in opposite directions to be released to the ambient, as depicted by the diffusion pathways. Accordingly, out-diffusion of hydrogen may proceed at twice the rate that would otherwise occur without the second porous $n^+$-type layer 222. In other embodiments, the p-type layer may be a lower layer, e.g., below the porous layer. When located below the porous layer, hydrogen from the p-type layer may diffuse vertically to the porous layer, and then diffuse to the ambient.

Figure 10:
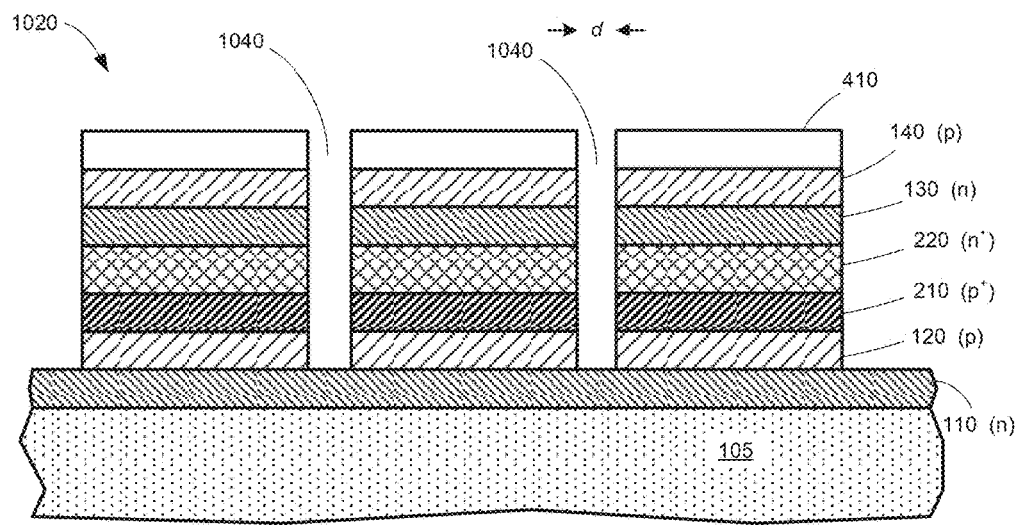
FIG. 10 depicts a variation of a device that includes a porous III-nitride layer to facilitate release of hydrogen, according to some embodiments.

In some embodiments, a lateral extent of a device may be so large (e.g., greater than about 100 microns) that it becomes difficult to porosify a buried $n^+$-type layer (e.g., layer 215 referring to FIG. 4B). For example, the distance required for lateral EC etching may be so large that lateral porification and/or out-diffusion of hydrogen would take a prohibitively long time. In such cases, a multilayer structure may be modified as depicted in FIG. 10. Vias 1040 may be etched into the multilayer structure to provide access for the electrolyte to interior regions of the structure during EC etching, and to provide pathways for hydrogen out-diffusion during thermal annealing. The vias 1040 may be patterned in any suitable shape (holes, crosses, trenches) and may have transverse dimensions d between approximately 50 nm and approximately 1 micron, though larger dimensions may be used in some cases. The vias may be distributed uniformly or randomly across the device. In some embodiments, the vias may comprise trenches running part way, or fully, across a device.

According to some embodiments, light-emitting devices may additionally benefit from one or more buried porous layers 220. Porification of a III-nitride layer reduces the layer's refractive index. For example, porification of GaN can change its refractive index value by as much as 0.5, which can produce an appreciable index difference at an interface between a porous and non-porous layer. This index difference and the scattering nature of the porous structure can improve the extraction efficiency of light from a light-emitting device. For example, the porous structure and index contrast can redirect light out of the device that would otherwise travel into and be lost in the substrate 105.

Figure 11:
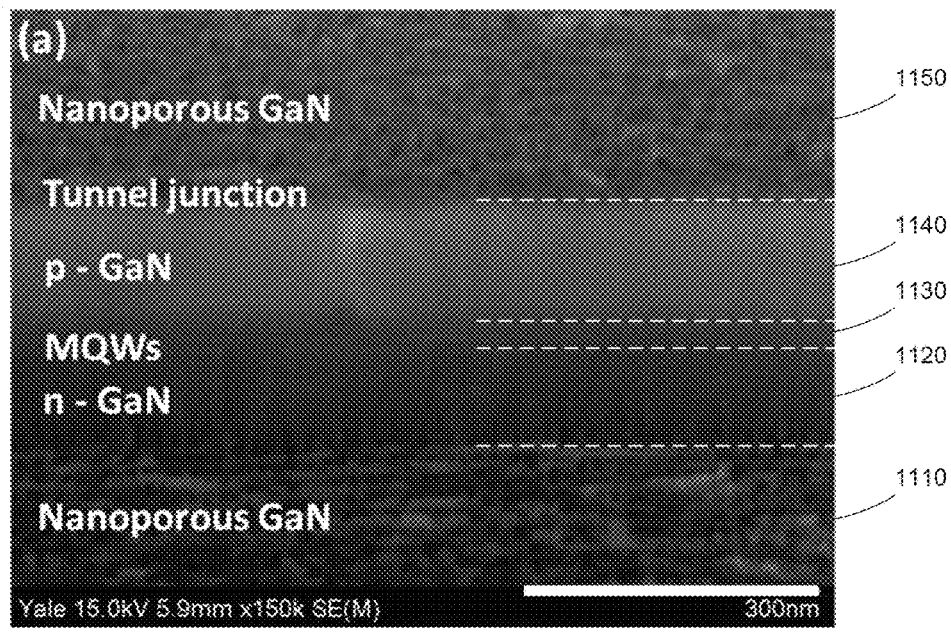
FIG. 11 is a scanning electron micrograph of a multilayer structure for a tunnel-junction LED that includes two nanoporous layers.

Another example of a light-emitting device structure is depicted in FIG. 11. The image shows a scanning-electron micrograph of a tunnel junction region of a light emitting diode. According to some embodiments, a tunnel junction LED may comprise an n-type gallium-nitride layer 1120, multiple quantum wells (MQWs) 1130, and a p-type gallium-nitride layer 1140 formed on a substrate. The n-type gallium-nitride layer, MQWs, and p-type gallium-nitride layer may be formed between two highly-doped, n-type gallium-nitride layers that are subsequently etched, according to the embodiments described above, to form porous gallium-nitride layers 1110, 1150. White, dashed lines have been added to the micrograph to show the approximate locations of the layer boundaries. The porous gallium-nitride layers are approximately 400 nm thick and may facilitate out-diffusion of acceptor-bound species from the p-type layer 1130, and p-doped layers of the MQWs.

Figure 12:
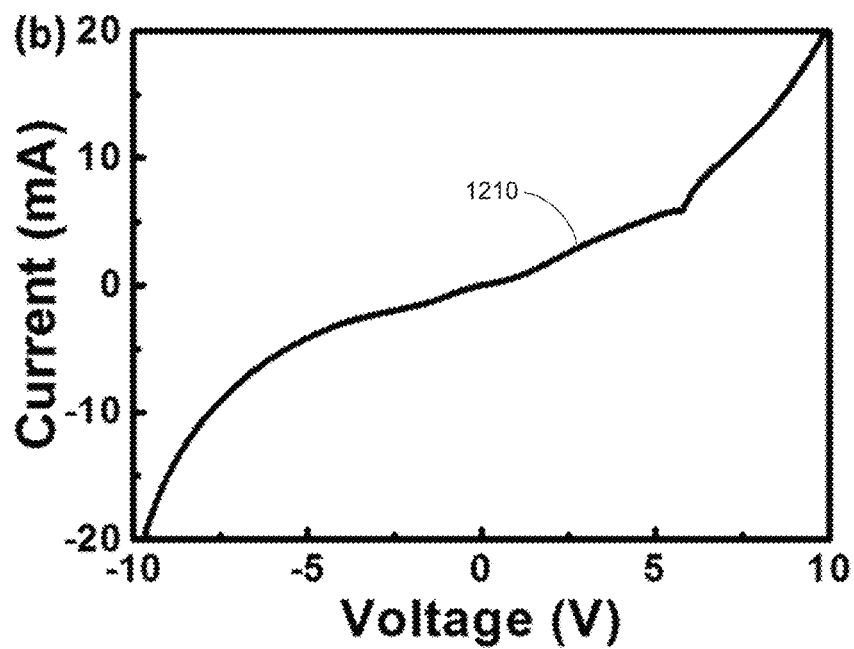
FIG. 12 is a current-voltage curve measured for the structure of FIG. 11.

An I-V characteristic of the multilayer structure of FIG. 11 was measured, and a resulting curve is shown in FIG. 12. The curve 1210 exhibits an approximately linear behavior between about −5 volts and 5 volts with a total resistance of about 1 kΩ. The size of the conductive and porous area, for which the I-V measurements were made, measured approximately 50 microns by approximately 300 microns. Lower resistance values are expected with further improvements to the multilayer structure.

CONCLUSION

The terms "approximately" and "about" may be used to mean within ±20% of a target dimension in some embodiments, within ±10% of a target dimension in some embodiments, within ±5% of a target dimension in some embodiments, and yet within ±2% of a target dimension in some embodiments. The terms "approximately" and "about" may include the target dimension.

The technology described herein may be embodied as a method, of which at least some acts have been described. The acts performed as part of the method may be ordered in any suitable way. Accordingly, embodiments may be constructed in which acts are performed in an order different than described, which may include performing some acts simultaneously, even though described as sequential acts in illustrative embodiments. Additionally, a method may include more acts than those described, in some embodiments, and fewer acts than those described in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

The invention claimed is:

1. An integrated device comprising:
   a substrate;
   a first n-type layer formed from III-nitride material;
   a first p-type layer formed from III-nitride material; and
   a first conductive, porous layer formed from III-nitride material and located adjacent to the first p-type layer,
   wherein the first conductive, porous layer is covered by a continuous layer of material that extends across pores and does not fill all the pores of the first conductive, porous layer and a portion of the first conductive, porous layer is exposed to an ambient,
   wherein the first conductive, porous layer is located between the first p-type layer and the continuous layer.

2. The integrated device of claim 1, wherein the first p-type layer is formed in a multilayer stack in which there are additional layers formed above and below the first p-type layer.

3. The integrated device of claim 1, wherein the first p-type layer is formed as a top layer of a multilayer stack.

4. The integrated device of claim 1, wherein the first p-type layer and the first n-type layer form a first pn junction.

5. The integrated device of claim 4, further comprising a second pn junction formed above and in series with the first pn junction.

6. The integrated device of claim 5, further comprising a second p-type layer located adjacent to the first p-type layer, wherein the second p-type layer has a dopant density greater than a dopant density of the first p-type layer and wherein the first conductive, porous layer physically contacts the second p-type layer.

7. The integrated device of claim 6, wherein a thickness of the second p-type layer is less than 1 micron.

8. The integrated device of claim 1, wherein the first conductive, porous layer comprises gallium nitride and has a dopant density between approximately $5 \times 10^{18}$ cm$^{-3}$ and approximately $2 \times 10^{20}$ cm$^{-3}$.

9. The integrated device of claim 8, wherein a majority of pore diameters in the first conductive, porous layer are between approximately 20 nm and approximately 150 nm.

10. The integrated device of claim 9, wherein a porosity of the first conductive, porous layer is between approximately 10% and approximately 50%.

11. The integrated device of claim 1, wherein the first n-type layer extends over a larger region of the substrate than the first p-type layer.

12. The integrated device of claim 1, wherein the first n-type layer is located adjacent to the substrate, the first conductive, porous layer is located over the first n-type layer, and the first p-type layer is located over the first conductive, porous layer.

13. The integrated device of claim 1, wherein the continuous layer of material comprises a second n-type layer formed adjacent to the first conductive, porous layer;
   the integrated device further comprising:
      a second conductive, porous layer formed adjacent to the second n-type layer; and
      a second p-type layer formed adjacent to the second conductive, porous layer.

14. The integrated device of claim 1, wherein the first p-type layer and the first n-type layer form a pn junction in a cascaded tunnel junction light-emitting diode.

15. The integrated device of claim 1, wherein the first p-type layer and the first n-type layer form a pn junction in a tandem junction solar cell.

16. The integrated device of claim 1, wherein the first p-type layer and the first n-type layer form a pn junction in a transistor.

17. The integrated device of claim 1, wherein the first p-type layer and the first n-type layer form a pn junction in a diode.

18. A method for fabricating an integrated device, the method comprising:
   forming a first n-type layer above a substrate from III-nitride material;
   forming a first p-type layer adjacent to the first n-type layer from III-nitride material; and
   forming a first conductive, porous layer adjacent to the first p-type layer from III-nitride material,
   wherein the first conductive, porous layer is covered by a continuous layer of material that extends across pores and does not fill all the pores of the first conductive, porous layer and a portion of the first conductive, porous layer is exposed to an ambient,
   wherein the first conductive, porous layer is located between the first p-type layer and the continuous layer.

19. The method of claim 18, further comprising thermally annealing the integrated device to dissociate and out-diffuse dopant-bound atomic species.

20. The method of claim 19, wherein an annealing temperature is between approximately 600° C. and approximately 800° C.

21. The method of claim 18, wherein forming the first conductive, porous layer comprises:
   forming a gallium-nitride n-type layer with a doping concentration between approximately $5 \times 10^{18}$ cm$^{-3}$ and approximately $2 \times 10^{20}$ cm$^{-3}$;
   etching the gallium-nitride n-type layer to form exposed sidewalls of the gallium-nitride n-type layer;
   electrochemically and laterally etching the gallium-nitride n-type layer to form the first conductive, porous layer.

22. The method of claim 21, wherein the electrochemically and laterally etching comprises:
   immersing the exposed sidewalls in an electrolyte of nitric acid; and
   applying an electrical potential between the electrolyte and the exposed sidewalls.

23. The method of claim 22, wherein the nitric acid has a concentration between approximately 15 M and approximately 18 M and the electrical potential has a substantially constant value between approximately 1 volt and approximately 10 volts.

24. The method of claim 18, further comprising:
forming a second p-type layer adjacent to the first p-type layer before forming the first conductive, porous layer, wherein a thickness of the second p-type layer is less than 1 micron;
forming a second n-type layer adjacent to the first conductive, porous layer; and
forming a third p-type layer adjacent to the second n-type layer.

25. The method of claim 24, wherein the first p-type layer and the first n-type layer form a first pn junction, the third p-type layer and the second n-type layer form a second pn junction, and the second p-type layer forms a tunneling barrier between the first pn junction and the second pn junction.

26. The method of claim 24, further comprising:
patterning a hard mask over the third p-type layer; and
transferring a pattern of the hard mask by anisotropically etching the third p-type layer, the second n-type layer, the first conductive, porous layer, the second p-type layer, and the first p-type layer.

27. The method of claim 26, wherein the anisotropic etching forms a mesa that includes at least one buried p-type layer.

28. An integrated device comprising:
a first n-type layer formed from III-nitride material;
a first p-type layer formed from III-nitride material; and
a first conductive, porous layer formed from III-nitride material comprising laterally-etched pores,
wherein the first conductive, porous layer physically contacts the first p-type layer or physically contacts a buffer layer that physically contacts the first p-type layer,
wherein a portion of the first conductive, porous layer is exposed to an ambient,
wherein the laterally-etched pores extend from a side surface of the first conductive, porous layer that is exposed to the ambient and have a diameter that is less than a thickness of the first conductive, porous layer.

* * * * *

UNITED STATES PATENT AND TRADEMARK OFFICE
CERTIFICATE OF CORRECTION

PATENT NO. : 11,018,231 B2  
APPLICATION NO. : 14/954195  
DATED : May 25, 2021  
INVENTOR(S) : Jung Han et al.

It is certified that error appears in the above-identified patent and that said Letters Patent is hereby corrected as shown below:

In the Claims

In Claim 28, Column 14, Line 7, insert --a substrate;-- on a separate line, directly before the line that begins "a first n-type layer..."

Signed and Sealed this  
Twenty-seventh Day of July, 2021

Drew Hirshfeld  
*Performing the Functions and Duties of the*  
*Under Secretary of Commerce for Intellectual Property and*  
*Director of the United States Patent and Trademark Office*